United States Patent
Chang et al.

(10) Patent No.: US 10,177,654 B1
(45) Date of Patent: Jan. 8, 2019

(54) DUAL-EDGE PULSE WIDTH MODULATION FOR MULTIPHASE SWITCHING POWER CONVERTERS WITH CURRENT BALANCING

(71) Applicant: DIALOG SEMICONDUCTOR (UK) LIMITED, London (GB)

(72) Inventors: Kevin Yi Cheng Chang, Phoenix, AZ (US); James Doyle, Phoenix, AZ (US)

(73) Assignee: DIALOG SEMICONDUCTOR (UK) LIMITED, London (GB)

( * ) Notice: Subject to any disclaimer, the term of this patent is extended or adjusted under 35 U.S.C. 154(b) by 0 days.

(21) Appl. No.: 15/791,270

(22) Filed: Oct. 23, 2017

(51) Int. Cl.
  H02M 3/156 (2006.01)
  H02M 1/08 (2006.01)
  H03K 3/037 (2006.01)
  H03K 5/24 (2006.01)
  H03K 19/0175 (2006.01)

(52) U.S. Cl.
  CPC ............ H02M 3/156 (2013.01); H02M 1/08 (2013.01); H03K 3/037 (2013.01); H03K 5/24 (2013.01); H03K 19/017509 (2013.01)

(58) Field of Classification Search
  CPC ...... H02M 1/084; H02M 3/156–3/158; H02M 3/1584; H02M 2003/1586; H02M 2001/0025
  USPC ...... 323/242, 272, 284, 288; 363/65, 74, 80, 363/123
  See application file for complete search history.

(56) References Cited

U.S. PATENT DOCUMENTS

| 8,957,660 | B2 | 2/2015 | Chen et al. | |
|---|---|---|---|---|
| 9,369,043 | B2* | 6/2016 | Couleur | H02M 3/1584 |
| 2004/0008011 | A1 | 1/2004 | Wang et al. | |
| 2009/0153114 | A1 | 6/2009 | Huang | |
| 2012/0223692 | A1* | 9/2012 | Prodic | H02M 3/157 |
| | | | | 323/283 |
| 2013/0293203 | A1* | 11/2013 | Chen | H02M 1/084 |
| | | | | 323/234 |

(Continued)

OTHER PUBLICATIONS

Su et al., "Pseudo-Ramp Current Balance (PRCB) Technique With Offset Cancellation Control (OCC) in Dual-Phase DC-DC Buck Converter," ieee Transactions on Very Large Scale Integration (VLSI) Systems, Oct. 11, 2013, pp. 2192-2205, vol. 22—No. 10, IEEE, Pescataway, New Jersey/USA.

*Primary Examiner* — Yemane Mehari
(74) *Attorney, Agent, or Firm* — Haynes and Boone, LLP

(57) ABSTRACT

In one or more embodiments, a method comprises comparing an output voltage for a multi-phase DC-DC switching power converter to a reference voltage to produce an error voltage. The method further comprises, for a first inductor, generating a first dual-ramp voltage signal having a first DC voltage level, and level-shifting the first dual-ramp voltage signal to form a second dual-ramp voltage signal having a second DC voltage level different from the first DC voltage level. Further, the method comprises switching on a first power switch coupled to the first inductor according to a duty cycle determined responsive to a comparison of the second dual-ramp voltage signal to the error voltage, where the level-shifting of the first dual-ramp voltage signal adjusts the duty cycle of the first power switch to balance a current in the first inductor with a current in a second inductor for the multi-phase DC-DC switching power converter.

20 Claims, 12 Drawing Sheets

(56) References Cited

U.S. PATENT DOCUMENTS

2016/0013719 A1* 1/2016 Babazadeh ........... H02M 3/157
                                                                                       323/271
2017/0229961 A1    8/2017  Zhang et al.

* cited by examiner

DUAL-EDGE PULSE WIDTH MODULATION FOR MULTIPHASE SWITCHING POWER CONVERTERS WITH CURRENT BALANCING

FIELD

The present disclosure relates to switching power converters, and more particularly to dual-edge pulse width modulation for multiphase switching power converters.

BACKGROUND

In multiphase switching power converters, there are multiple inductors and corresponding power switches. Ideally, the currents through the various inductors are all equal. But non-idealities lead to current imbalances for the inductors. Such a current imbalance can cause the inductors to enter into saturation. It is thus conventional to implement current balancing techniques in a multiphase switching power converter to balance the currents across the inductors.

Currently, some conventional methods to balance the inductor currents operate by changing the slope of a ramp voltage for a pulse width modulator (PWM) of the power converter. This change in slope of the ramp voltage will adjust the duty cycle of the PWM for a given power switch and in turn adjust the current through the corresponding inductor. However, since these methods change the slope of the ramp voltage, these methods have the disadvantage of impacting the closed-loop transfer function, which can affect the stability of the switching power converter.

Accordingly, there is a need in the art for an improved current-balancing scheme for multiphase switching power converters to ensure robustness of the power converter regulation.

SUMMARY

The present disclosure relates to a method, system, and apparatus for dual-edge pulse width modulation for high-frequency multiphase converters. In one or more embodiments, a disclosed method comprises comparing an output voltage for a multi-phase DC-DC switching power converter to a reference voltage to produce an error voltage. The method further comprises, for a first inductor in the multi-phase DC-DC switching power converter, generating a first dual-ramp voltage signal having a first DC voltage level, and level-shifting the first dual-ramp voltage signal to form a second dual-ramp voltage signal having a second DC voltage level different from the first DC voltage level.

Further, the method comprises switching on a first power switch coupled to the first inductor according to a duty cycle determined responsive to a comparison of the second dual-ramp voltage signal to the error voltage, where the level-shifting of the first dual-ramp voltage signal adjusts the duty cycle of the first power switch to balance a current in the first inductor with a current in a second inductor for the multi-phase DC-DC switching power converter.

The features, functions, and advantages can be achieved independently in various embodiments of the present disclosure or may be combined in yet other embodiments.

DRAWINGS

These and other features, aspects, and advantages of the present disclosure will become better understood with regard to the following description, appended claims, and accompanying drawings where:

FIG. 1 is a diagram showing an exemplary power converter that may be employed for the disclosed system and method for dual-edge pulse width modulation for high-frequency multiphase converters, in accordance with at least one embodiment of the present disclosure.

FIG. 2 comprises graphs showing the timing for normal operations of a dual-edge pulse width modulator (PWM), in accordance with at least one embodiment of the present disclosure.

Figure 9:
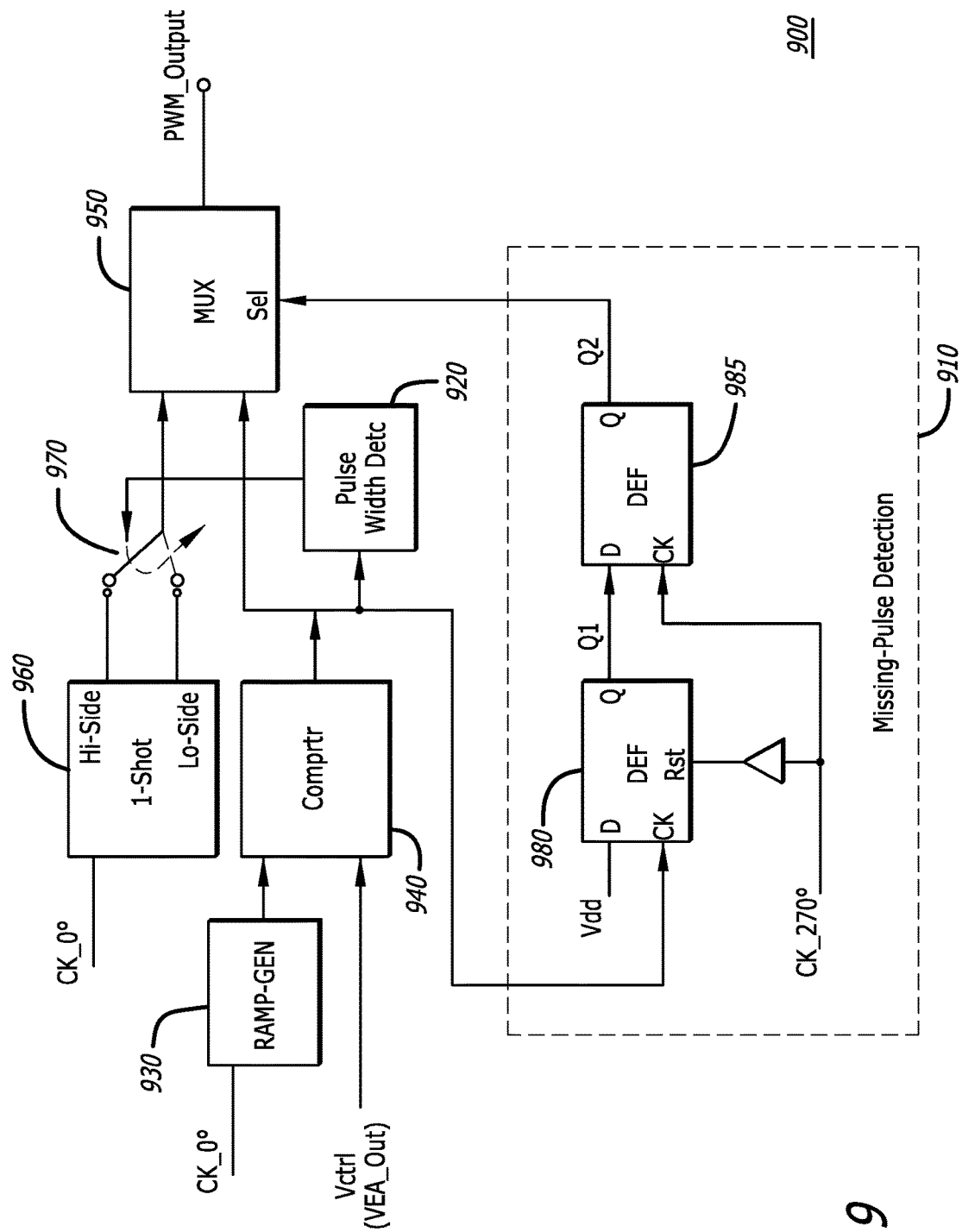
FIG. 9 is a diagram showing a disclosed one-shot generation scheme that may be employed by the disclosed dual-edge PWM of FIG. 3, in accordance with at least one embodiment of the present disclosure.
Figure 10:
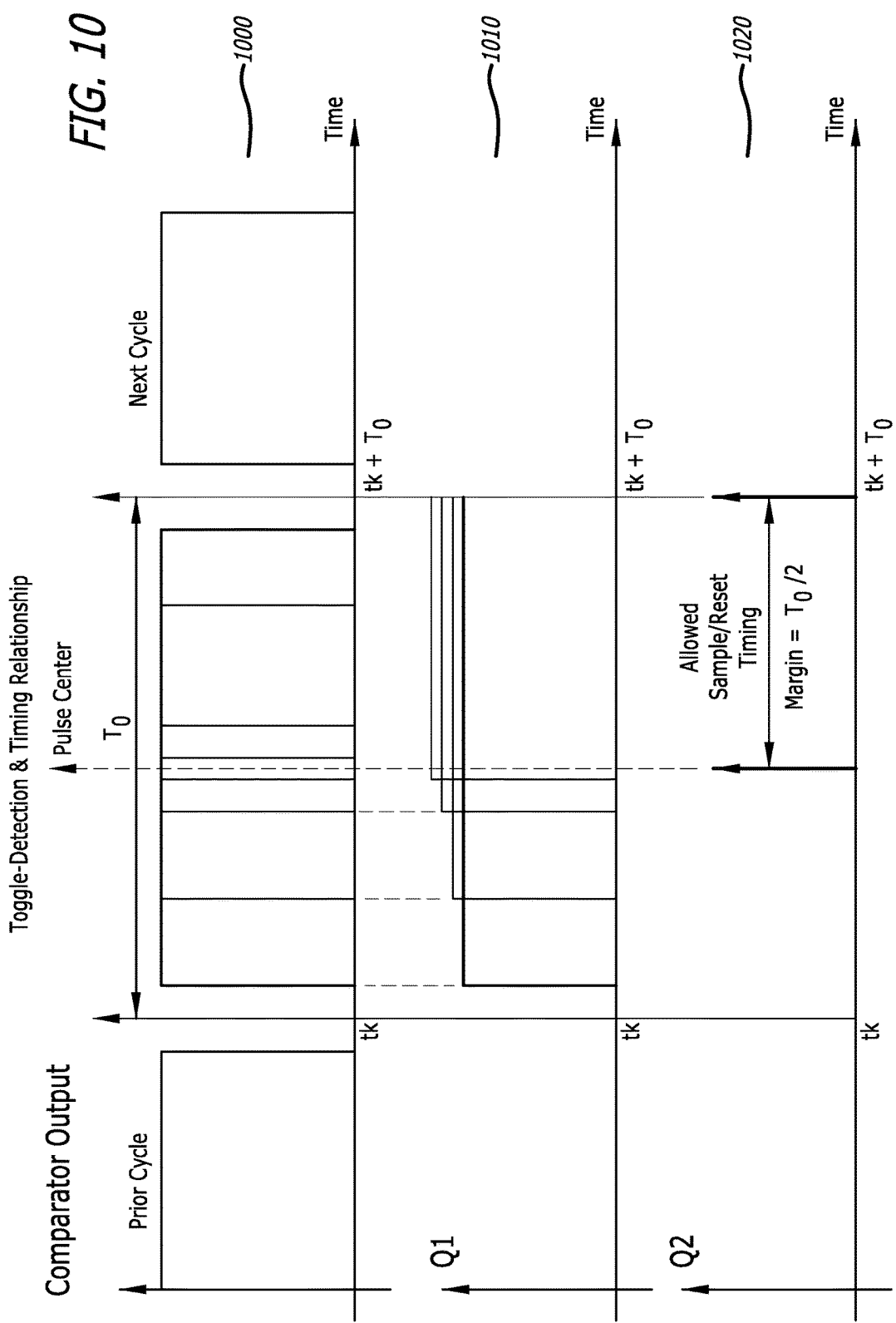

FIG. 10 comprises graphs showing the timing for the missing pulse detection circuit of FIG. 9, in accordance with at least one embodiment of the present disclosure.

Figure 11:
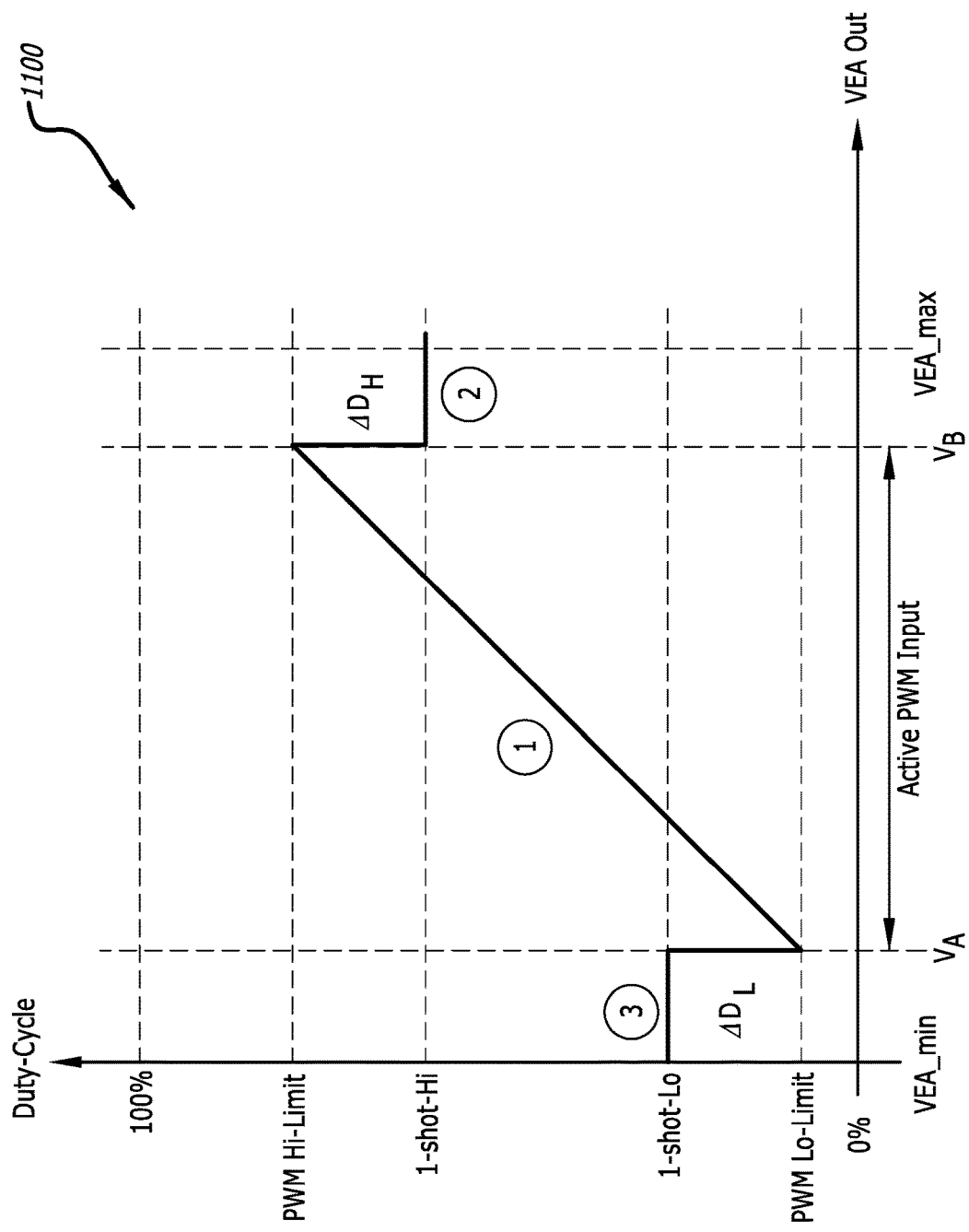

FIG. 11 is graph showing the composite dual-edge PWM output characteristics with active pulse width modulation and non-monotonic one-shot transfer functions, in accordance with at least one embodiment of the present disclosure.

Figure 12:
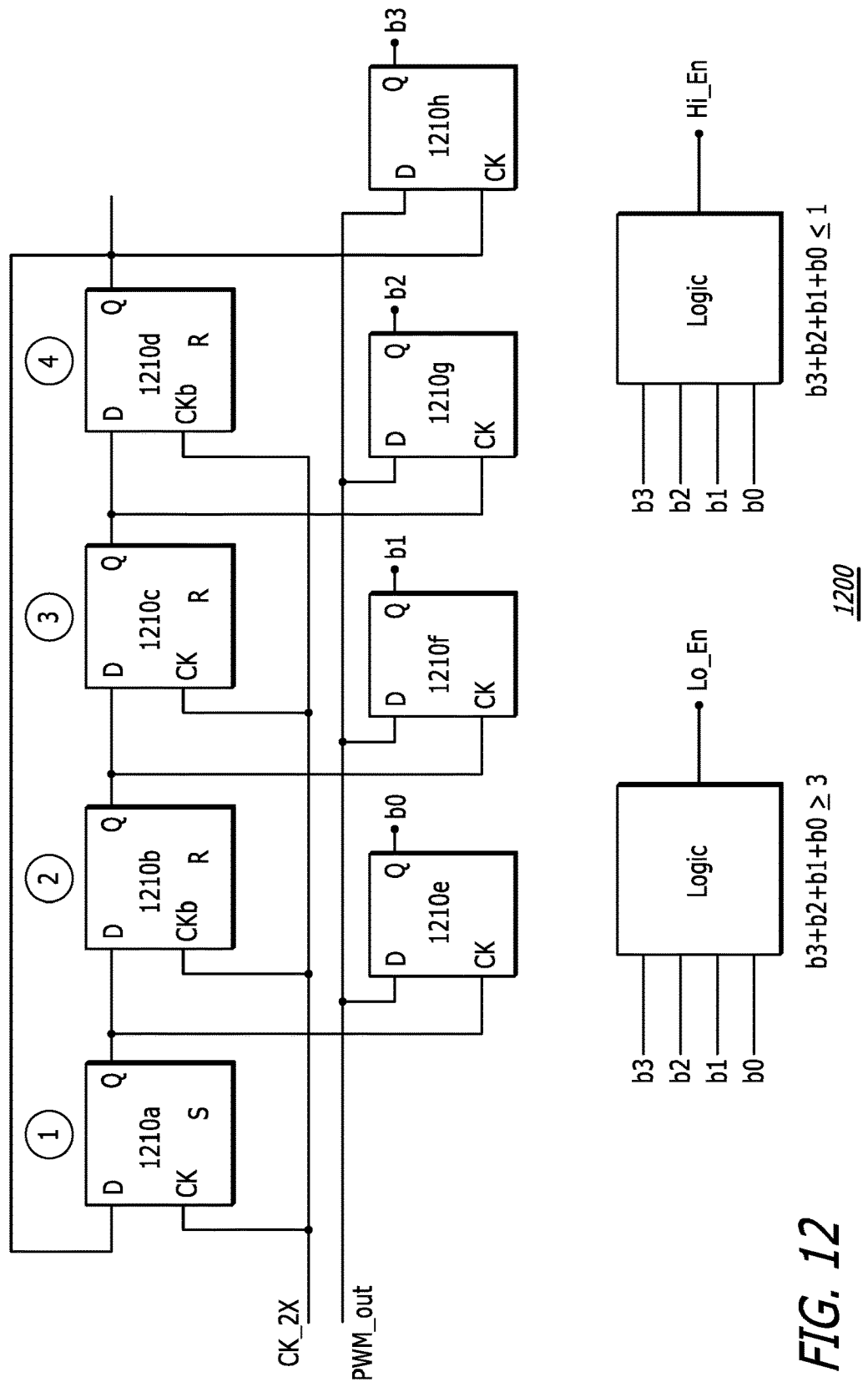

FIG. 12 is a diagram showing a disclosed pulse width detection circuit that may be employed for the pulse width detector of FIG. 9, in accordance with at least one embodiment of the present disclosure.

DESCRIPTION

The methods and apparatus disclosed herein provide an operative system for dual-edge pulse width modulation for multiphase switching power converters with improved current balancing. Although not limited to any particular switching frequency, the system of the present disclosure enables current balancing for a dual-edge pulse width modulated (PWM) multi-phase switching power converter operating at a high frequency (e.g., greater than or equal to 100 megahertz (MHz)). A current-balancing approach using a ramp voltage DC level (i.e. the average ramp voltage) control for the dual-edge PWM duty-cycle adjustments is disclosed. Because the DC ramp voltage is level shifted, the dual-edge PWM gain is maintained constant independently of the amount of level shifting. In addition, a one-shot generator is incorporated in the disclosed system to provide auxiliary pulse-width generation in case a missing-pulse condition occurs.

In one or more embodiments, the system of the present disclosure comprises three main features. The first main feature is a current balancing technique that uses a controlled DC-offset on the dual-edge ramp generator (ramp gen) center voltage. The second main feature is a common-mode feedback (CMFB) control for the dual-edge ramp generator. The third main feature is a missing pulse detection with a one-shot pulse generated at both the maximum limit and the minimum limit of the dual-edge PWM duty cycle to guard against missing pulses. This protective pulse width modulation duty cycle has a non-monotonic transfer-characteristic that ensures that the error amplified voltage ($V_{EA}$) does not swing to a level where the loop gain is so low that it causes in interruption in the control loop.

In the following description, numerous details are set forth in order to provide a more thorough description of the system. It will be apparent, however, to one skilled in the art, that the disclosed system may be practiced without these specific details. In the other instances, well known features have not been described in detail so as not to unnecessarily obscure the system.

Embodiments of the present disclosure may be described herein in terms of functional and/or logical components and various processing steps. It should be appreciated that such components may be realized by any number of hardware, software, and/or firmware components configured to perform the specified functions. For example, an embodiment of the present disclosure may employ various integrated circuit components (e.g., memory elements, digital signal processing elements, logic elements, look-up tables, or the like), which may carry out a variety of functions under the control of one or more processors, microprocessors, or other control devices. In addition, those skilled in the art will appreciate that embodiments of the present disclosure may be practiced in conjunction with other components, and that the system described herein is merely one example embodiment of the present disclosure.

For the sake of brevity, conventional techniques and components related to multiphase power converters, and other functional aspects of the system (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in an embodiment of the present disclosure.

Figure 1:
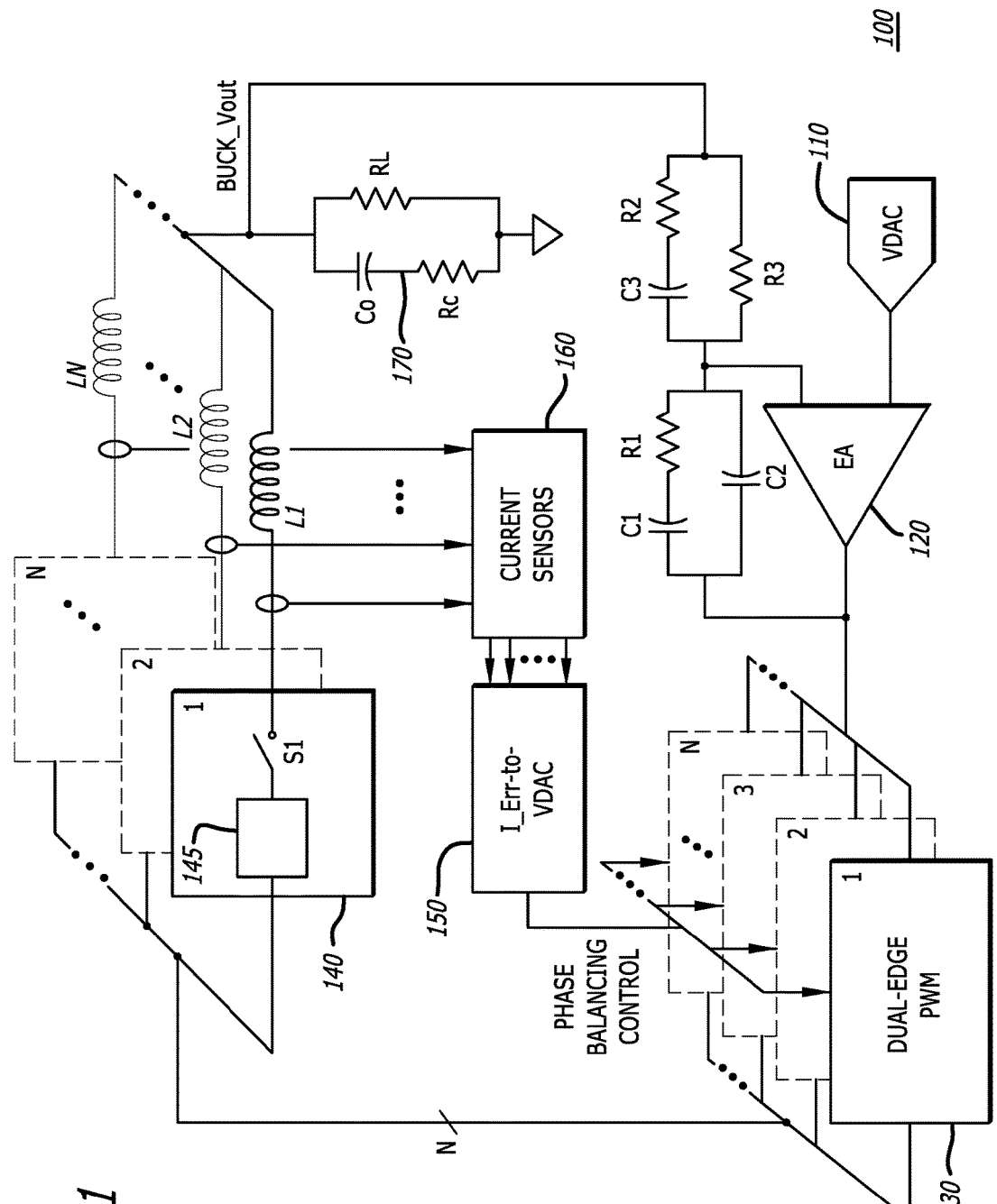

FIG. 1 illustrates an exemplary multiphase buck converter 100. However, it should be noted that other types of conventional multiphase DC-DC power converters may profit from the current balancing techniques disclosed herein such as multiphase buck-boost converters and boost converters. In multiphase buck converter 100, each phase has its own inductor. Thus a first phase includes a first inductor L1, a second phase includes a second inductor L2, and so on such that an Nth phase includes an Nth inductor LN. Each phase also has its own switch driver 145 and switch, collectively referred to as element 140. For illustration clarity, switch driver 145 and a switch S1 are shown only for the first phase. When a switch is closed by its switch driver 145, a current will flow through the corresponding inductor. For example, when switch S1 is closed, a current flows through inductor L1. The pulse width modulation for the switch on-time is dual edge such that both the rising edge for the switch on-time and the falling edge at the switch off-time are modulated to control an output voltage (BUCK_Vout) on an output node for the buck converter. To regulate the output voltage, each phase has its own dual-edge pulse-width modulator 130 that determines the pulse width for the phase's power switch on-time. The output voltage drives a load (represented by a resistance RL) and is smoothed by an output capacitor C0 in series with a resistor RC. A filtered version of the output voltage is compared at an error amplifier (EA) 120 to a reference voltage from a reference source such as voltage digital-to-analog converter (VDAC) 110 to produce an error voltage. As will be explained further herein, each dual-edge PWM 130 compares a dual-edge ramp signal to the error voltage to control the pulse width for its phase's power switch on-time. The error voltage and output voltage are smoothed at the error amplifier 120 through a loop filter formed by a capacitor C1, a capacitor C2, a capacitor C3, a resistor R1, a resistor R2, and a resistor R3. It will be appreciated that such loop filtering is exemplary and may be varied in alternative embodiments.

Since the discrete inductors L1, L2, LN typically will have some device mismatches such as mismatched series resistances, the inductors L1, L2, LN can potentially carry different amounts of peak or average currents during their switch on times. The inductors L1, L2, LN can then enter saturation if the current-unbalance condition becomes significant. As such, a current-balancing scheme should be incorporated into this multi-phase architecture to ensure robustness of the buck regulation. To effect this current balancing, the inductor currents in each phase are sensed by current sensors 160. The error (I_Err) for a given inductor current as compared to the desired balanced inductor current may then be converted into a current-imbalance voltage by a VDAC as represented by element 150. The dual-edge ramp signal from dual ramp generator (explained further herein) in the corresponding dual-edge PWM 130 may then be level shifted responsive to the current-imbalance voltage to effect the desired current balancing.

Figure 2:
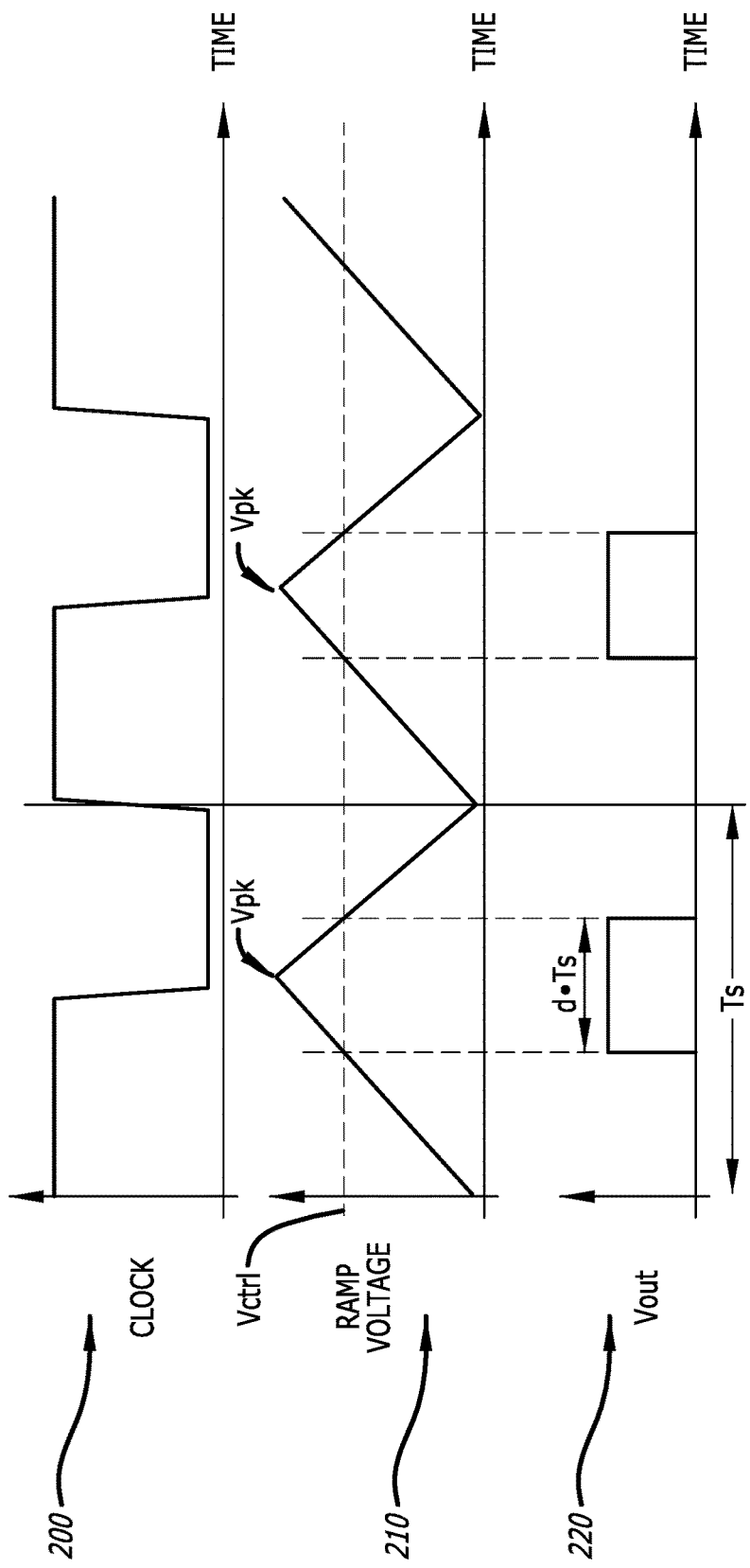

The ramp generation may be better understood with reference to FIG. 2, which shows graphs for the timing of normal operations of a dual-edge pulse width modulator (PWM) 130, in accordance with at least one embodiment of the present disclosure. A ramp voltage 210 is generated by a dual-edge ramp generator (discussed further below) in dual-edge PWM 130. A ramp voltage with dual edges has the advantage of providing a higher loop gain than a ramp voltage with a single edge since both the rising and falling edges of the pulsing of the power switch are modulated. In contrast, a single-edge PWM can only modulate one of these edges.

A clock signal 200 toggles between one and zero. During operation, the dual-edge ramp generator in dual-edge PWM 130 will generate ramp voltage 210 based on clock signal 200. For example, the ramp generator may begin increasing ramp voltage 210 responsive to the rising edge of clock signal 200 and begin decreasing responsive to the falling edge of clock signal 200. As such, when clock signal 200 is a binary high, the dual-edge ramp generator will generate ramp voltage 210 with a positive slope (i.e. a ramp up); and when clock signal 200 is a binary zero, the dual-edge ramp generator will generate ramp voltage 210 with a negative slope (i.e. a ramp down). Ramp voltage 210 has a peak voltage (Vpk) at the falling edge of clock signal 200.

Dual-edge PWM 130 includes a comparator (discussed further below) that compares ramp voltage 210 to the error voltage from error amplifier 120 (the error voltage may also be designated as a control voltage, Vctrl). As such, when ramp voltage 210 rises above Vctrl, the comparator will trigger driver 145 to close the corresponding switch to begin a power switch on-time pulse 220. The period for clock signal 200 is designated as Ts. The pulse width for switch on-time pulse 220 is thus d*Ts, where d is the duty cycle. It should be noted that in some embodiments, the clock signal may be modulated to not have a 50-50 split between pulsed-high and pulsed-low states. For such embodiments, the dual-edge PWM modulation of the rising and falling edges for the pulsing of the power switch will be asymmetric.

Figure 3:
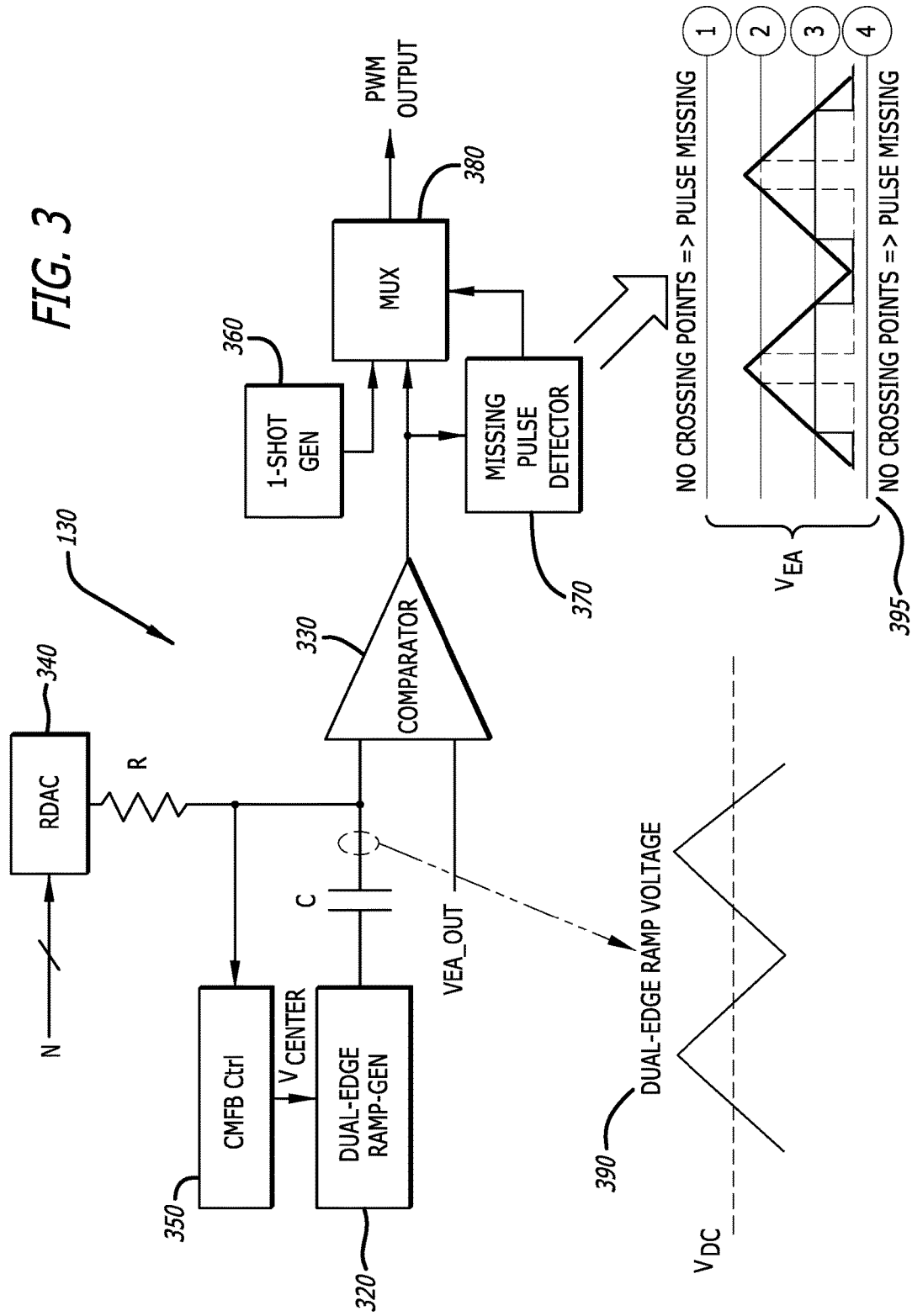
FIG. 3 is a diagram showing the disclosed dual-edge PWM, in accordance with at least one embodiment of the present disclosure.

FIG. 3 is a diagram 300 showing additional details for dual-edge PWM 130 in accordance with at least one embodiment of the present disclosure. As previously mentioned above, the inductors L1, L2, LN of a multiphase converter can potentially carry different amount of currents such that one or more of the inductors L1, L2, LN can enter saturation if the current-unbalance condition becomes significant. Dual-edge PWM 130 provides a solution for current balancing among the inductors L1, L2, LN of a multiphase converter. As such, the dual-edge PWM 130 of FIG. 3 may be employed in each of the phases for buck converter 100 of FIG. 1 to ensure the robustness of the multiphase converter regulation. The disclosed dual-edge PWM 130 of FIG. 3 performs a DC-level shift of its generated ramp voltage to adjust the dual-edge PWM 130 duty cycle, which in turn, adjusts the inductor current.

In FIG. 3, dual-edge PWM 130 is shown to comprise four main functional blocks. The first main functional block comprises a dual-edge ramp generator (ramp gen) 320 with current steering topology. The second main functional block comprises a high-speed comparator 330 with specified short propagation-delay. The third main functional block comprises a resistor capacitor (RC) alternating current (AC) coupled network with a resistive analog-to-digital converter (RDAC) 340 (alternatively, a VDAC may be employed) to generate the ramp center voltage (Vcenter) and a common-mode feedback (CMFB) control circuit 350. The fourth main functional block comprises a one-shot generator 360 and associated missing pulse detection circuit 370 and multiplexer (MUX) 380.

During operation of dual-edge PWM 130, a binary N-bit control signal is inputted into the RDAC 340 to adjust the direct current (DC) voltage level ($V_{DC}$) of a resulting level-shifted dual-ramp voltage signal 390. It should be noted that in one or more embodiments, different types of digital-to-analog converters (DACs) may be employed for RDAC 340 of dual-edge PWM 130. During operation, dual-edge ramp generator 320 generates a first ramp voltage that is not level-shifted. This first ramp voltage is AC coupled through a capacitor C and combined with the DC voltage from RDAC 340 to produce level-shifted dual-ramp voltage signal 390. Comparator 330 compares level-shifted dual-ramp voltage signal 390 to the error voltage (VEA_OUT) from error amplifier 120 to pulse the corresponding power switch on for the duty cycle d discussed with regard to FIG. 2. Note that should the error voltage rise greater than the peak voltage for level-shifted dual-ramp voltage signal 390, no pulse would be generated. A missing pulse detector 370 functions to detect such a missing pulse. Conversely, if the error voltage is less than this peak voltage, the power switch will be pulsed on in each period of clock signal 200. A one-shot generator 360 functions to generate a pulse having a certain minimum pulse width should missing pulse detector 370 detect a missing pulse. A multiplexer (MUX) 380 functions to select between the output of comparator 330 and one-shot generator 360. During normal operation of dual-edge PWM 130, MUX 380 selects for the output of comparator 330 to control the pulsing of the corresponding power switch. However, when missing pulse detection circuit 370 detects at least one missing pulse in the pulse sequence outputted from comparator 330, MUX 380 selects for the output of one-shot generator 360 to pulse the corresponding power switch on. A graph 395 shows a plot of the error amplified voltage ($V_{EA}$) at different voltage levels (1 thru 4) as compared to ramp voltage signal 390. The error amplifier output voltage ($V_{EA\_out}$) level dictates the pulse width of the pulses outputted by dual-edge PWM 130. Since, in graph 395, the error voltage ($V_{EA}$) does not intersect with dual-ramp voltage signal 390 at both the level 1 and the level 4 values, missing pulse detection circuit 370 will then determine that a pulse is missing in the sequences of pulses outputted by comparator 330 for both those cases. Conversely, pulses would be generated when the error voltage equals either of the level 2 or level 3 values. When missing pulse detection circuit 370 determines that a pulse is missing, MUX 380 will select for the one-shot generator output to control the corresponding power switch. As will be explained further herein, there are two types of one-shot pulses generated by one-shot generator 360. In particular, note that the pulses become narrower and narrower as the error voltage rises towards the peak value for dual-edge ramp voltage 390. Once the error voltage exceeds this peak value, the output of comparator 330 remains low and is not toggled high across the cycles of clock signal 200. Missing pulse detector 370 detects this constant-low state for the comparator output and triggers one-shot generator 360 to generate a minimum-width (hi-side) pulse. Conversely, as the error voltage falls below the minimum value for dual-edge ramp voltage 390, the comparator output signal remains high and is not toggled low across the cycles of clock signal 200. Missing pulse detector 370 detects this constant-high state for the comparator output and triggers one-shot generator 360 to generate a maximum-width (lo-side) pulse.

Figure 4:
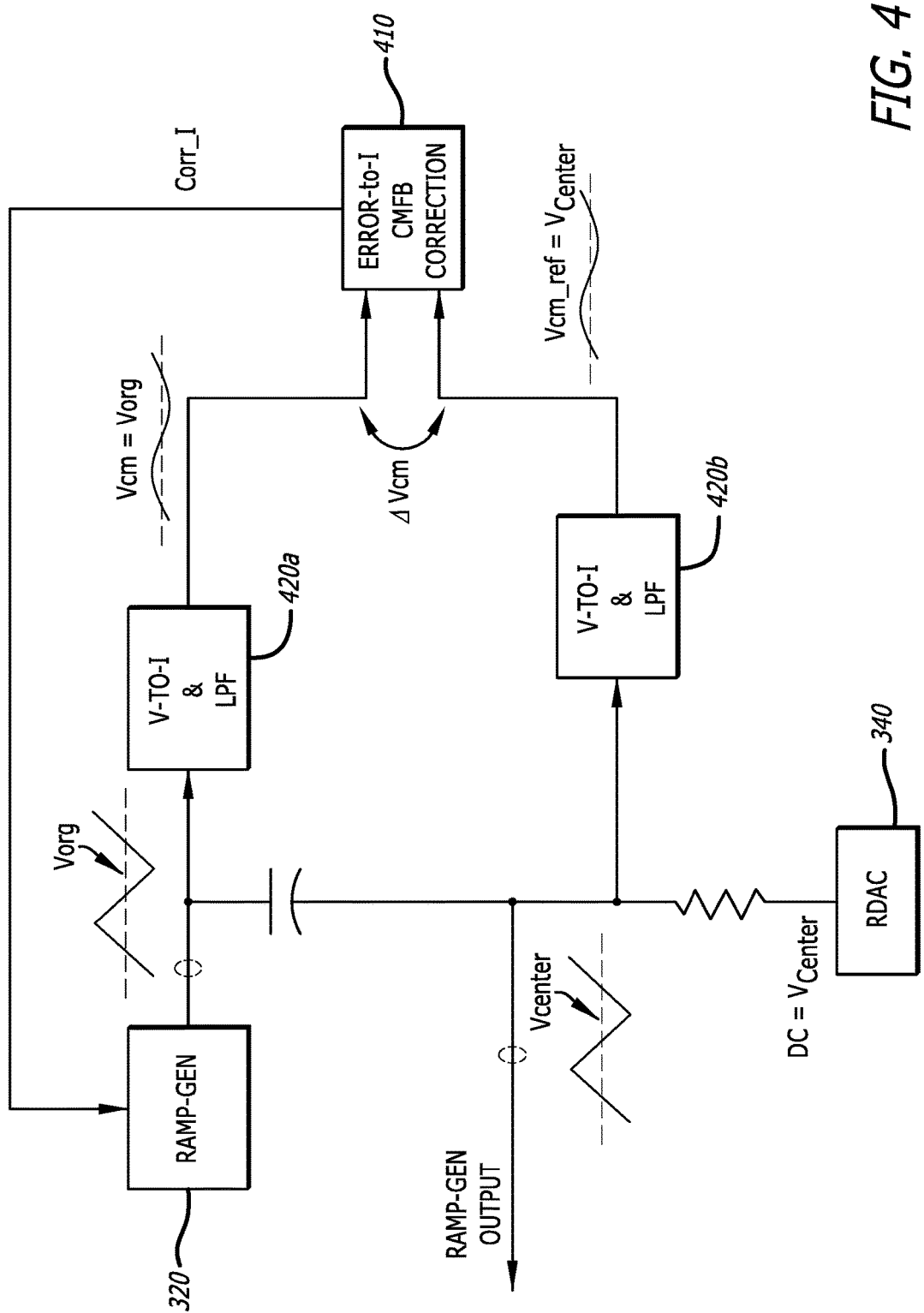
FIG. 4 is a diagram showing a disclosed common-mode feedback control circuit comprising an AC-coupled scheme and low-pass filtering that may be employed by the disclosed dual-edge PWM of FIG. 3, in accordance with at least one embodiment of the present disclosure.

It will be appreciated that common-mode feedback control circuit 350 of FIG. 3 is optional. Its function is to adjust the DC level for the un-shifted dual-ramp voltage signal generated by dual-edge ramp generator 320 to prevent saturation of the un-shifted dual-ramp voltage signal. For example, if the DC level (Vorg) of the un-shifted dual-ramp voltage signal rose too close to the power supply voltage, the un-shifted ramp signal would saturate at the power supply voltage for portions of each clock cycle. FIG. 4 shows additional details for the common-mode feedback control using an AC-coupled scheme and low-pass filtering that may be employed by dual-edge PWM 130. In FIG. 4, the common-mode feedback (CMFB) control is implemented with an error-to-current (Error-to-I) common mode feedback (CMFB) correction circuit 410. Two voltage-to-current (V-to-I) and low pass filter (LPF) circuits 420a, 420b, each with a voltage to current conversion in conjunction with a low pass filtering, are also shown. In addition, dual-edge ramp generator (ramp gen) 320 and RDAC 340 (alternatively, a VDAC may be employed) are included.

During operation, dual-edge ramp generator 320 generates a ramp voltage with an un-shifted direct current (DC) voltage level equaling the original voltage (Vorg). RDAC 440 adjusts the direct current (DC) voltage level of the generated ramp voltage to be at a center voltage (Vcenter), which ideally is offset from Vorg by the difference of the common mode voltage (ΔVcm). This shift in the DC level of generated ramp voltage from Vorg to Vcenter adjusts the duty cycle for cycling of the power switch modulated by dual-edge PWM 130.

The original and level-shifted ramp voltages are inputted into the V-to-I and LPF circuits 420a, 420b to produce resultant signals. In particular V-to-I and LPF 420a converts the un-shifted ramp signal into a signal with a DC level equaling Vorg. Similarly, V-to-I and LPF 420b converts the level-shifted ramp signal into a signal with a DC level equaling VCenter. Then, the resultant signals are inputted into the Error-to-I CMFB correction circuit 410. The Error-to-I CMFB correction circuit 410 determines the difference (ΔVcm) between the DC voltage levels of the resultant signals, and generates a correction current (Corr_I) based on the determined difference. The Corr_I is inputted into dual-edge ramp generator 430 to adjust Vorg accordingly.

Figure 5:
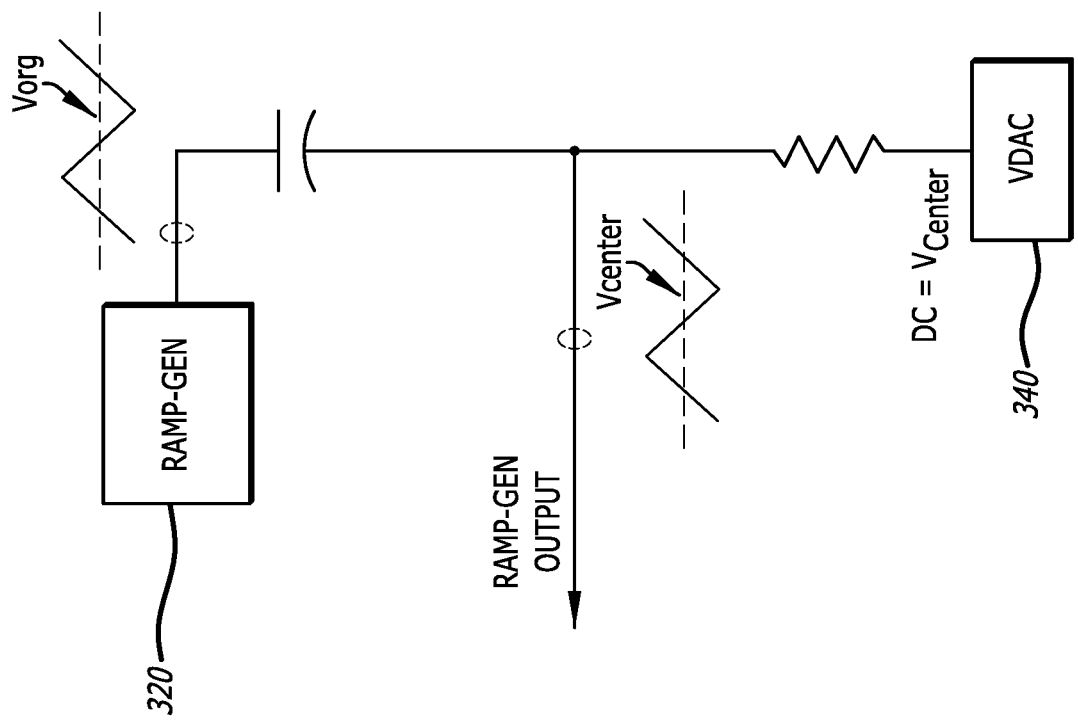
FIG. 5 is a diagram showing a disclosed AC-coupling scheme circuit that may be employed by the disclosed dual-edge PWM of FIG. 3, in accordance with at least one embodiment of the present disclosure.

As noted above, the common-mode feedback control is optional. FIG. 5 shows an AC-coupling scheme that may be employed by dual-edge PWM 130. During operation, dual-edge ramp generator 320 generates an un-shifted ramp voltage signal with a direct current (DC) voltage level at the original voltage (Vorg). VDAC 340 adjusts the direct current (DC) voltage level of the generated ramp voltage to be at the center voltage (Vcenter). This shift in the DC level of the level-shifted ramp voltage from Vorg to Vcenter adjusts the duty cycle for the power switch controlled by dual-edge PWM 130.

Figure 6:
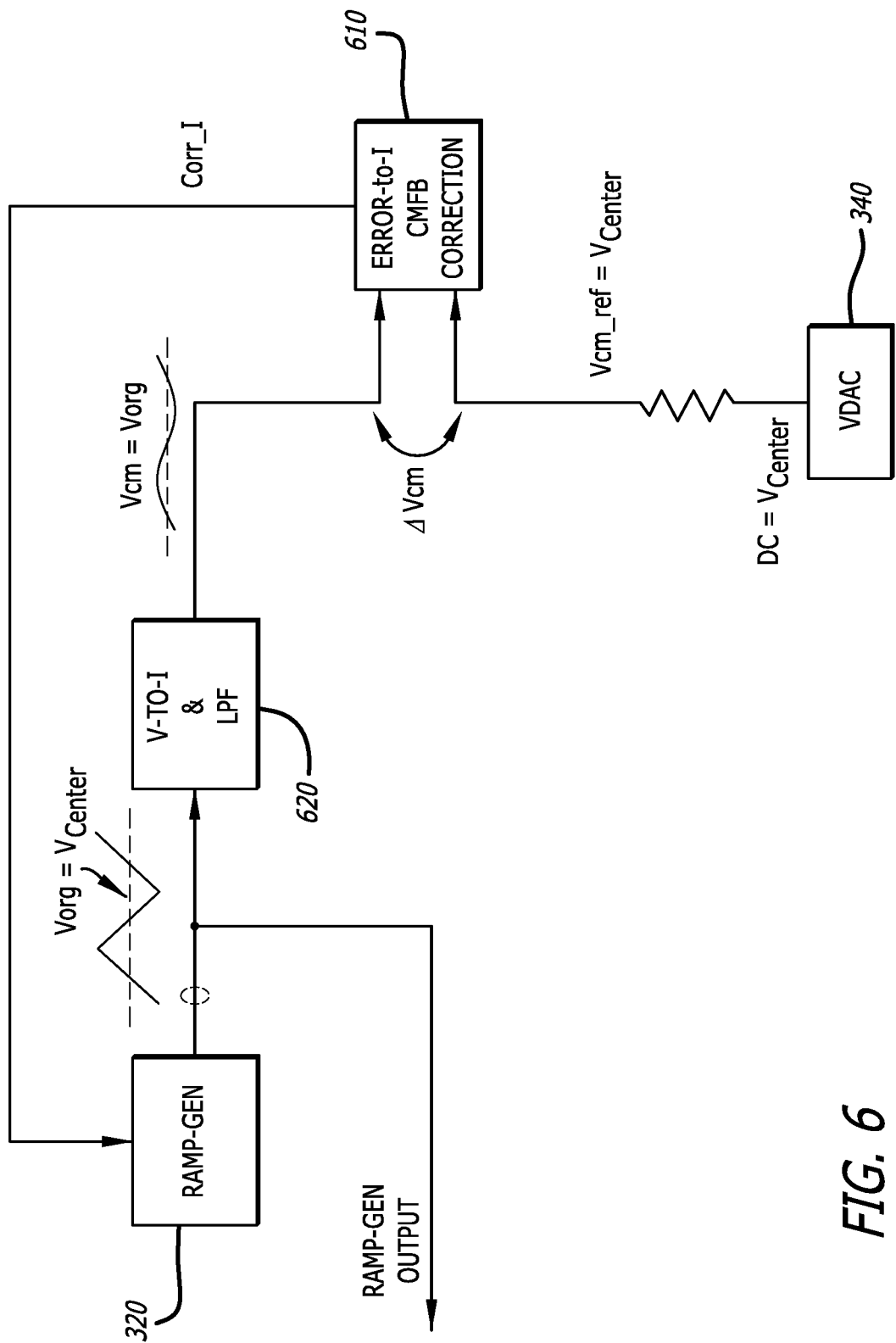
FIG. 6 is a diagram showing a disclosed DC-coupling scheme circuit that may be employed by the disclosed dual-edge PWM of FIG. 3, in accordance with at least one embodiment of the present disclosure.

The level-shifting of the ramp voltage signal may be performed without any AC coupling as shown in FIG. 6. Capacitor C of FIG. 3 is thus deleted such that the level-shifted ramp voltage signal is generated directly by ramp generator 320. A voltage-to-current (V-to-I) and low pass filter (LPF) circuit 620 converts the level-shifted ramp voltage signal into a signal having the DC value (Vorg) of level-shifted ramp voltage signal. There is a common mode error between Vorg and the desired value Vcenter. To detect this common mode error, VDAC 340 drives its DC voltage output Vcenter into an error-to-I CMFB correction circuit 610 that also receives the output of V-to-I and LPF circuit 620. The common mode error is thus converted into an error current Corr_I that forces ramp generator 320 to level-shift the DC value for its level-shifted ramp voltage signal to the desired value (Vcenter).

Figure 7:
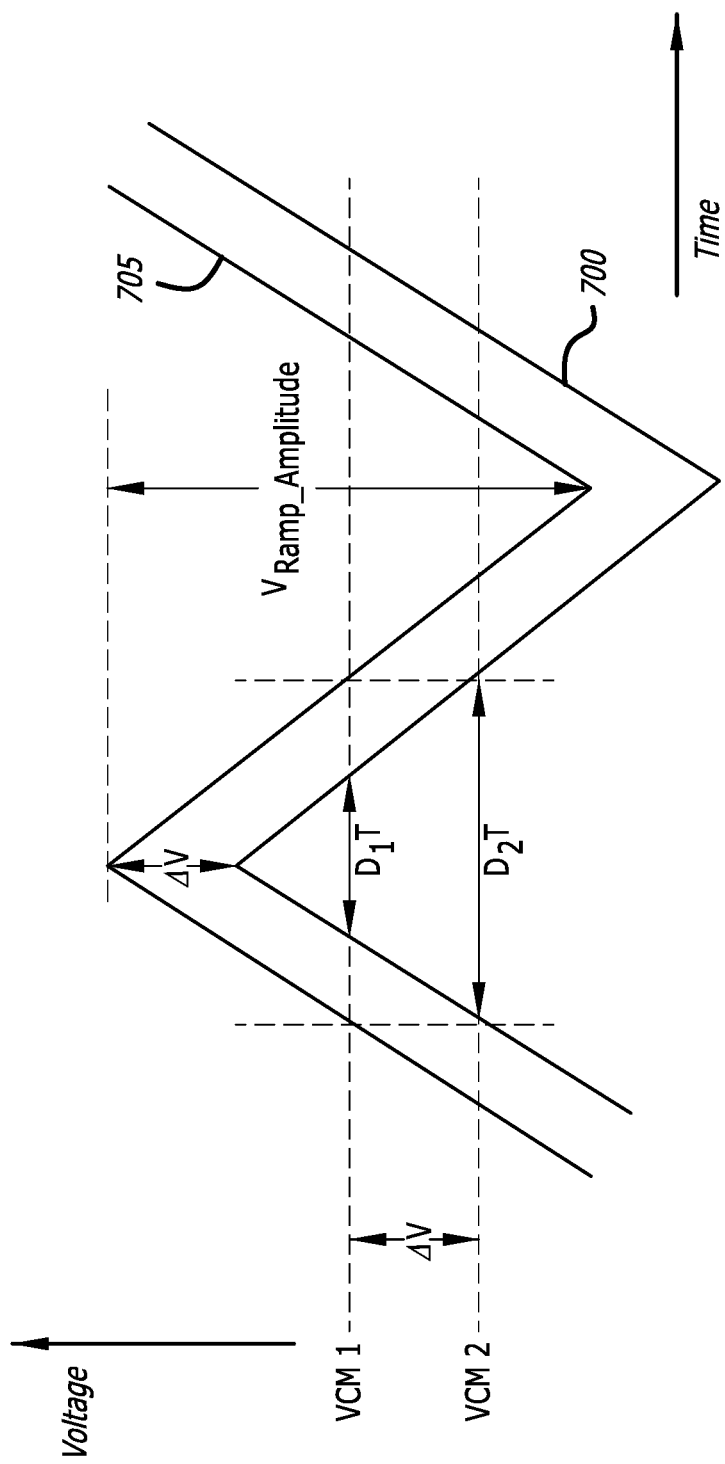
FIG. 7 is a graph illustrating the conversion of a DC level shift into a duty cycle offset, in accordance with at least one embodiment of the present disclosure.

Regardless of whether AC or DC coupling is used to level-shift the ramp voltage signal from ramp generator 320, the resulting level shifting is quite advantageous in balancing the inductor currents without the problems associated with prior art techniques. These advantages may be better appreciated with reference to FIG. 7, which shows the pulse widths resulting from the intersection of two different error voltages (VCM 1 and VCM 2) with a first ramp voltage signal 700. The difference between the error voltages is given by ΔV. Since VCM 2 is lower than VCM 1, the pulse width resulting from VCM 2 is wider than the pulse width resulting from VCM 1. In particular, the pulse width resulting from VCM 2 is given by D2*T, where D2 is the duty cycle resulting from VCM 2 and T is the clock period. Similarly, the pulse width resulting from VCM 1 is given by D1*T, where D1 is the duty cycle resulting from VCM 1. The difference in the pulse widths is thus given by D2*T−D1*T, which equals the product of ΔV with the ratio of $T/V_{Ramp\_Amplitude}$, where $V_{Ramp\_Amplitude}$ equals the valley-to-peak amplitude for ramp voltage signal 700. The pulse width resulting from error voltage VCM 1 can be produced by error voltage VCM 1 if ramp voltage signal 700 is level-shifted by ΔV to form a level-shifted voltage ramp signal 705. The level-shifting from ramp voltage signal 700 to 705 thus produces a duty-cycle offset equaling the level shift (ΔV) times the ratio of the clock cycle to the ramp amplitude. Note how advantageous this result is: the gain in the duty cycle change is constant and merely depends upon the ratio of the clock period to the ramp amplitude. In contrast, the prior art technique of changing the ramp slope to effect current balancing changed the PWM gain.

Figure 8:
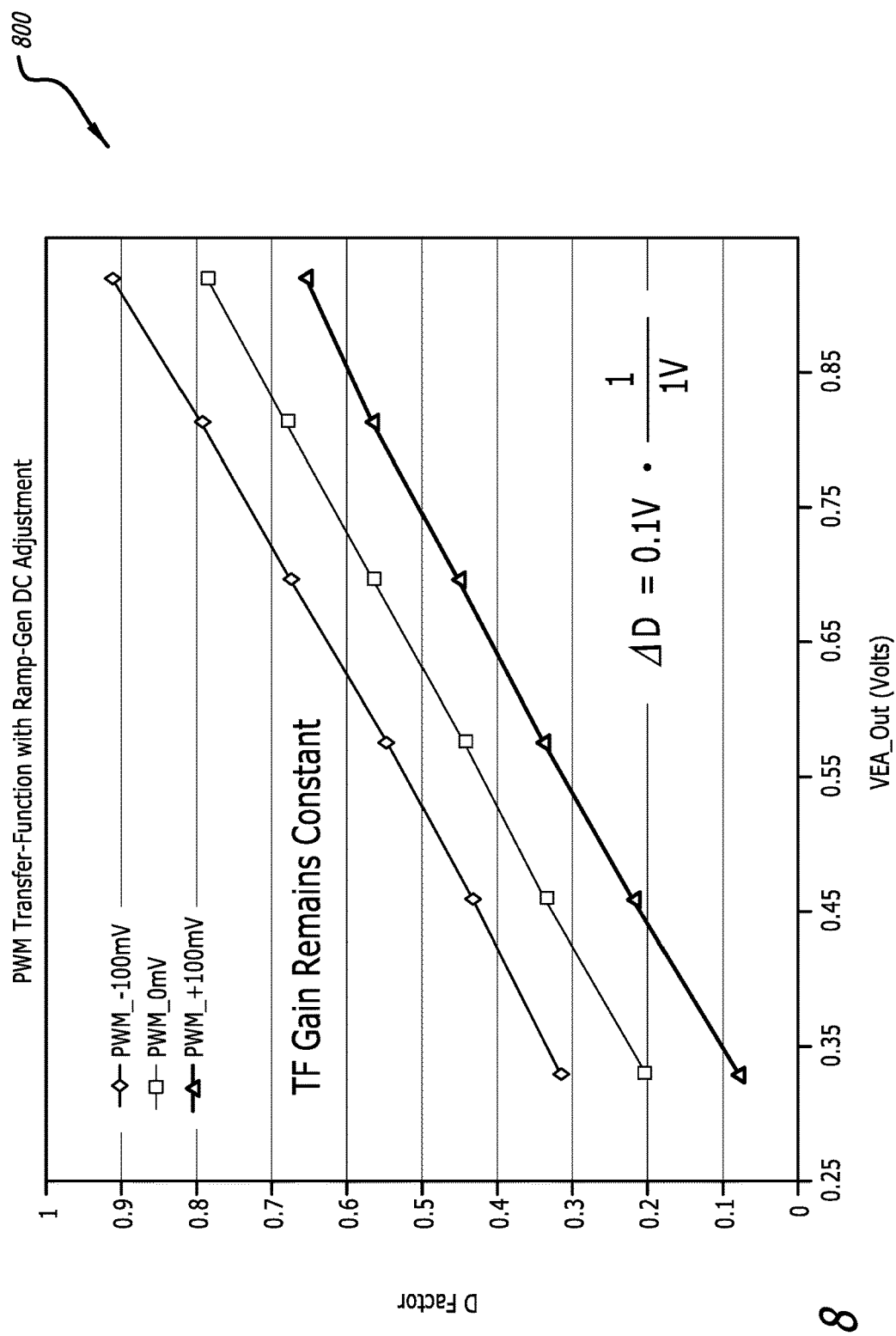
FIG. 8 is a graph showing simulation results illustrating the pulse width modulation transfer functions with DC adjustment, in accordance with at least one embodiment of the present disclosure.

FIG. 8 shows a graph 800 of simulation results illustrating the pulse width modulation transfer functions with level-shifting of the dual-ramp voltage signal, in accordance with at least one embodiment of the present disclosure. In this graph, the x-axis denotes the error amplified output voltage ($V_{EA\_out}$) in volts (V) and the y-axis denotes the D factor (i.e. the duty cycle divided by 100). This graph 800 shows the transfer functions for a disclosed dual-edge PWM with different voltage biases (i.e. −100, 0, and +100 millivolts (mV)). As shown on this graph 800, regardless of the amount of voltage bias applied to the disclosed dual-edge PWM, the transfer function (TF) gain will remain constant.

FIG. 9 is a diagram 900 showing a disclosed one-shot generation scheme that may be employed by the disclosed dual-edge PWM 130 of FIG. 3, in accordance with at least one embodiment of the present disclosure. In this figure, a dual-edge ramp generator (ramp gen) 930, a comparator 940, a missing pulse detection circuit 910, a pulse width detector 920, a multiplexer (MUX) 950, and a one-shot generator 960 are shown.

During operation, a clock signal (CK_0°) with a period starting at zero (0) degrees is inputted into the dual-edge ramp generator 930. The dual-edge ramp generator 930 generates a ramp voltage (e.g., refer to graph 390 on FIG. 3 showing a ramp voltage with a DC voltage level at $V_{DC}$). The generated ramp voltage and a control voltage (Vctrl) (which is the error amplified output voltage ($V_{EA\_out}$)) are inputted into the comparator 940. The comparator 940 converts the control voltage (Vctrl) into a pulse width, which is related to a duty cycle for the dual-edge PWM 130. The comparator 940 outputs a sequence of pulses, which is inputted into the pulse width detector 920 and the missing pulse detection circuit 910.

The pulse width detector 920 determines whether the sequence of pulses outputted from the comparator 940 corresponds to a low error amplified voltage ($V_{EA}$) (i.e. a $V_{EA}$ that is less than a predetermined $V_A$) or a high error amplified voltage ($V_{EA}$) (i.e. a $V_{EA}$ that is greater than a predetermined $V_B$). Referring to FIG. 11, it should be noted that the error amplified voltage ($V_{EA}$) is equal to a range (i.e. $V_{EA\_min}$ to $V_{EA\_max}$) of the error amplified output voltage ($V_{EA\_out}$); and the region from $V_A$ to $V_B$ within the error amplified voltage ($V_{EA}$) is where the pulse sequence outputted from the comparator 940 will not be missing a pulse.

Referring back to FIG. 9, if the pulse width detector 920 determines that the sequence of pulses outputted from the comparator 940 corresponds to a low error amplified voltage ($V_{EA}$) (i.e. a $V_{EA}$ that is less than a predetermined $V_A$), the pulse width detector 920 will switch a switch 970 (e.g., the pulse width detector 920 will send a signal to the switch 970 for the switch 970 to toggle accordingly) to switch the connection from the MUX 950 to a high-side of the one-shot generator 960. However, if the pulse width detector 920 determines that the sequence of pulses outputted from the comparator 940 corresponds to a high error amplified voltage ($V_{EA}$) (i.e. a $V_{EA}$ that is greater than a predetermined $V_B$), the pulse width detector 920 will switch the switch 970 e.g., the pulse width detector 920 will send a signal to the switch 970 for the switch 970 to toggle accordingly) to switch the connection from the MUX 950 to a low-side of the one-shot generator 960. Referring to both FIG. 9 and FIG. 11, it should be noted that the one-shot generator 960 generates at least one pulse with a pulse width corresponding to a one-shot high (1-shot-Hi) duty-cycle level, and outputs the pulse(s) on its high-side output. Also, the one-shot generator 960 generates at least one pulse with a pulse width corresponding to a one-shot low (1-shot-Lo) duty-cycle level, and outputs the pulse(s) on its low-side output.

Referring to FIG. 9, the missing pulse detection circuit 910 determines whether at least one pulse is missing in the pulse sequence outputted from the comparator 940. The missing pulse detection circuit 910 is shown to comprise two delay (D) flip-flops 980, 985 connected together in cascade. During operation of the missing pulse detection circuit 910, the pulse sequence outputted from the comparator 940 and a drain supply voltage (Vdd) are inputted into the first D flip-flop 980. Also, a clock signal (CK_270°) with a period starting at 270 degrees is inputted into the first D flip-flop 980 and the second D flip-flop 985. It should be noted that the clock signal with a delay of 270 degrees is utilized because the comparator 940 inherently has a delay and, as such, the clock signal with a delay of 270 degrees is used to compensate for the delayed output from the comparator 940.

During operation of the first D flip-flop 980, when the pulse sequence outputted from the comparator 940 does not contain at least one missing pulse, the first D flip-flop 980 will output a Q1 pulse, which is inputted into the second D flip-flop 980. During operation of the second D flip-flop 985, when a Q1 pulse is inputted into the second D flip-flop 985, the second D flip-flop 985 will output a Q2 pulse, which is inputted into the MUX 950. When the MUX 950 receives a Q2 pulse from the missing pulse detection circuit 910, the MUX 950 will select (SEL) to receive the sequence of pulses outputted from the comparator 940, and the MUX 950 will output (PWM_Output) that sequence of pulses. However, when the MUX 950 does not receive a Q2 pulse from the missing pulse detection circuit 910, the MUX 950 will select (SEL) to receive the pulse(s) outputted from the one-shot generator 960, and will output (PWM_Output) the pulse(s). The sequence of pulses outputted (PWM_Output) by the MUX 950 indicates the duty cycle for the dual-edge PWM 130.

FIG. 10 comprises graphs 1000, 1010, 1020 showing the timing for the missing pulse detection circuit 910 of FIG. 9, in accordance with at least one embodiment of the present disclosure. In this figure, graph 1000 shows an exemplary sequence of pulses outputted from the comparator, graph 1010 shows an exemplary Q1 pulse outputted from the first D flip-flop of the missing pulse detection circuit, and graph 1020 shows a region within a clock cycle that an exemplary Q2 pulse is outputted from the second D flip-flop of the missing pulse detection circuit.

In graph 1000, the pulses, from three different clock cycles, outputted from the comparator, are shown. Also on graph 1000, To denotes the duration of one clock cycle starting at time tk and ending at time tk+To. On this graph, four exemplary widths for the second pulse are shown.

In graph 1010, an exemplary Q1 pulse is shown. On this graph 1010, four exemplary pulse widths, for the Q1 pulse, corresponding to the four exemplary widths for the second pulse of the comparator of graph 1000 are shown.

In graph 1020, exemplary Q2 pulses are shown to indicate the region of the clock cycle that a Q2 pulse may be outputted from the second D flip-flop of the missing pulse detection circuit.

FIG. 11 is graph 1100 showing the composite dual-edge PWM output characteristics with active pulse width modulation and non-monotonic one-shot transfer functions, in accordance with at least one embodiment of the present disclosure. On graph 1100, the x-axis denotes the error amplified output voltage ($V_{EA\_out}$), and the y-axis denotes the duty-cycle of the dual-edge PWM 130. In addition, the error amplified voltage ($V_{EA}$) is equal to a range (i.e. $V_{EA\_min}$ to $V_{EA\_max}$) of the error amplified output voltage ($V_{EA\_out}$). The region from $V_A$ to $V_B$ within the error amplified voltage ($V_{EA}$) is where the pulse sequence outputted from the comparator is not missing a pulse. And, the region from $V_{EA\_min}$ to $V_A$ and the region from $V_{EA\_max}$ to $V_B$ is where the pulse sequence outputted from the comparator is missing at least one pulse.

During operation of the dual-edge PWM 130, when the dual-edge PWM 130 is operating in region 1 denoted on the graph, the pulse sequence outputted from the comparator is not missing a pulse. For this region, the pulse sequence outputted from the comparator is outputted from the dual-edge PWM 130.

When the dual-edge PWM 130 is operating in region 2 denoted on the graph, the pulse sequence outputted from the comparator is missing at least one pulse and the error amplified voltage ($V_{EA}$) is greater than $V_B$. For this region, the pulse(s) outputted from the high-side output of the one-shot generator is outputted from the dual-edge PWM 130. Also for this region, the duty-cycle of the dual-edge PWM 130 is lower than the PWM high limit (Hi-Limit) duty cycle in order to bring the operation of the dual-edge PWM 130 back to region 1 (i.e. active region).

And, when the dual-edge PWM 130 is operating in region 3 denoted on the graph, the pulse sequence outputted from the comparator is missing at least one pulse and the error amplified voltage ($V_{EA}$) is less than $V_A$. For this region, the pulse(s) outputted from the low-side output of the one-shot generator is outputted from the dual-edge PWM 130. Also for this region, the duty-cycle of the dual-edge PWM 130 is higher than the PWM low limit (Lo-Limit) duty cycle in order to bring the operation of the dual-edge PWM 130 back to region 1 (i.e. active region).

FIG. 12 is a diagram 1200 showing a disclosed pulse width detection circuit that may be employed for the pulse width detector 920 of FIG. 9, in accordance with at least one embodiment of the present disclosure. In this figure, eight (8) flip-flops 1210a-1210h are shown to be connected together. The circuit shown in this figure comprises logic to determine whether the sequence of pulses (PWM_out) outputted from the comparator 940 (refer to FIG. 9) corresponds to a low error amplified voltage ($V_{EA}$) (i.e. a $V_{EA}$ that is less than a predetermined $V_A$) or to a high error amplified voltage ($V_{EA}$) (i.e. a $V_{EA}$ that is greater than a predetermined $V_B$).

During operation of the pulse width detection circuit, a clock signal (CK_2X), which is two times the rate of the clock signal (CK_0°) that is inputted into the dual-edge ramp generator 930 (refer to FIG. 9), is inputted into the pulse width detection circuit. And, the sequence of pulses (PWM_out) outputted from the comparator 940 is inputted into the pulse width detection circuit. The four flip-flops 1210a-1210d in the top row generate sample times four times per clock cycle. The four flip-flops 1210e-1210h in the bottom row read a pulse (of the sequence of pulses) at those four sample times, and each of the four flip-flops 1210e-1210h output a reading b0, b1, b2, b3, respectively, where each b corresponds to a reading at one of the four samples times. If b3+b2+b1+b0 is greater than or equal to three (3), then the pulse width detection circuit will determine that the sequence of pulses (PWM_out) outputted from the comparator 940 corresponds to a low error amplified voltage ($V_{EA}$) (i.e. a $V_{EA}$ that is less than a predetermined $V_A$) and the pulse width detection circuit will enable a low output (Lo_En). However, if b3+b2+b1+b0 is less than or equal to one (1), then the pulse width detection circuit will determine that the sequence of pulses (PWM_out) outputted from the comparator 940 corresponds to a high error amplified voltage ($V_{EA}$) (i.e. a $V_{EA}$ that is greater than a predetermined $V_B$) and the pulse width detection circuit will enable a high output (Hi_En).

Although particular embodiments have been shown and described, it should be understood that the above discussion is not intended to limit the scope of these embodiments. While embodiments and variations of the many aspects of the invention have been disclosed and described herein, such disclosure is provided for purposes of explanation and illustration only. Thus, various changes and modifications may be made without departing from the scope of the claims.

Where methods described above indicate certain events occurring in certain order, those of ordinary skill in the art having the benefit of this disclosure would recognize that the ordering may be modified and that such modifications are in accordance with the variations of the present disclosure. Additionally, parts of methods may be performed concurrently in a parallel process when possible, as well as performed sequentially. In addition, more parts or less part of the methods may be performed. Accordingly, embodiments are intended to exemplify alternatives, modifications, and equivalents that may fall within the scope of the claims.

We claim:

1. A method comprising:
   comparing an output voltage for a multi-phase DC-DC switching power converter to a reference voltage to produce a control voltage;
   for a first inductor in the multi-phase DC-DC switching power converter, generating a first dual-ramp voltage signal having a first DC voltage level;
   level-shifting the first dual-ramp voltage signal to form a second dual-ramp voltage signal having a second DC voltage level different from the first DC voltage level; and;
   switching on a first power switch coupled to the first inductor according to a duty cycle determined responsive to a comparison of the second dual-ramp voltage signal to the control voltage, wherein the level-shifting of the first dual-ramp voltage signal adjusts the duty cycle of the first power switch to balance a current in the first inductor with a current in a second inductor for the multi-phase DC-DC switching power converter.

2. The method of claim 1, wherein the multiphase DC-DC switching power converter is one of a buck converter, a buck-boost converter, or a boost converter.

3. The method of claim 1, wherein the level-shifting of the first dual-ramp voltage signal to form the second dual-ramp voltage signal is performed by a controllable digital-to-analog converter (DAC).

4. The method of claim 3, wherein the controllable DAC is one of a voltage digital-to-analog converter (VDAC) or a resistive digital-to analog converter (RDAC).

5. The method of claim 1, wherein the comparison of the second dual-ramp voltage signal to the control voltage is performed by a comparator.

6. The method of claim 1, wherein the method further comprises:
   generating, by a common-mode feedback (CMFB) correction circuit of a dual-edge pulse width modulator (PWM) of the multi-phase DC-DC switching power converter, a correction current based on a difference between the first DC voltage level and the second DC voltage level; and
   inputting, into a ramp generator of the dual-edge PWM, the correction current to adjust the first DC voltage level.

7. The method of claim 1, wherein the method further comprises:
   converting, by a comparator of a dual-edge PWM, the second dual-ramp voltage signal, into a sequence of pulses.

8. The method of claim 7, wherein the method further comprises:
   determining, with a pulse width detector of the dual-edge PWM, whether pulses in the sequence of pulses correspond to a low level for the control voltage or to a high level for the control voltage.

9. The method of claim 8, wherein the method further comprises:
   selecting to output, from a one-shot generator of the dual-edge PWM, at least one pulse with a pulse width corresponding to a one-shot high duty cycle level, when the pulse width detector determines that the pulses correspond to the high level for the control voltage; and
   selecting to output, from the one-shot generator, at least one pulse with a pulse width corresponding to a one-shot low duty cycle level, when the pulse width detector determines that the pulses correspond to the low level for the control voltage.

10. The method of claim 8, wherein the method further comprises:
    using a plurality of flip-flops to determine whether the pulses in the sequence of pulses correspond to the low level for the control voltage or to the high level for the control voltage.

11. The method of claim 7, wherein the method further comprises:
    determining, by a missing pulse detection circuit of the dual-edge PWM, whether at least one pulse from the sequence of pulses is missing from the sequence of pulses.

12. The method of claim 11, wherein the method further comprises:
    using two delay (D) flip-flops to determine whether the at least one pulse from the sequence of pulses is missing.

13. The method of claim 12, wherein the method further comprises:
    inputting a clock signal with a delay into at least one of the two D flip-flops.

14. The method of claim 13, wherein the method further comprises:
    selecting the dual-edge PWM to output the sequence of pulses from the comparator, when the missing pulse detection circuit determines that no pulses from the sequence of pulses are missing; and
    selecting the dual-edge PWM to output at least one pulse generated by a one-shot generator of the dual-edge PWM, when the missing pulse detection circuit determines that the at least one pulse from the sequence of pulses is missing.

15. A system for a multiphase DC-DC switching power converter comprising:
    a first inductor;
    a second inductor;

a dual-edge pulse width modulator (PWM), associated with the first inductor, the dual-edge PWM including a dual-edge ramp generator configured to generate a first dual-ramp voltage signal having a first DC voltage level, wherein the dual-edge PWM is further configured to level-shift the first dual-ramp voltage signal to form a second dual-ramp voltage signal having a second DC voltage level different from the first DC voltage level, the dual-edge PWM including a comparator configured to compare the second dual-ramp voltage signal to a control voltage, and a first power switch, coupled to the first inductor, operable to be switched according to a duty cycle determined responsive to an output signal from the comparator, wherein the level-shifting of the first dual-ramp voltage signal adjusts the duty cycle of the first power switch to balance a current in the first inductor with a current in a second inductor for the multi-phase DC-DC switching power converter.

16. The system of claim 15, wherein the multiphase DC-DC switching power converter is one of a buck converter, a buck-boost converter, or a boost converter.

17. The system of claim 15, wherein the system further comprises a controllable digital-to-analog converter (DAC) operable to perform the level-shifting of the first dual-ramp voltage signal to form the second dual-ramp voltage signal.

18. The system of claim 17, wherein the controllable DAC is one of a voltage digital-to-analog converter (VDAC) or a resistive digital-to analog converter (RDAC).

19. The system of claim 15, wherein the system further comprises an error amplifier configured to generate the control voltage responsive to a comparison of an output voltage to a reference voltage.

20. The system of claim 19, wherein the system further comprises a pulse width detector of the dual-edge PWM operable to determine whether pulses in the sequence of pulses correspond to a low level for the control voltage or to a high level for the control voltage.

* * * * *